United States Patent
Kiyoshi et al.

(10) Patent No.: US 9,043,676 B2
(45) Date of Patent: May 26, 2015

(54) PARITY ERROR RECOVERY METHOD FOR STRING SEARCH CAM

(75) Inventors: Nishino Kiyoshi, Tokyo (JP); Tadayuki Okada, Tokyo (JP); Kiyoshi Takemura, Tokyo (JP); Nobuyoshi Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 13/977,002

(22) PCT Filed: Oct. 4, 2011

(86) PCT No.: PCT/JP2011/072891
§ 371 (c)(1),
(2), (4) Date: Jun. 27, 2013

(87) PCT Pub. No.: WO2012/090564
PCT Pub. Date: Jul. 5, 2012

(65) Prior Publication Data
US 2013/0283135 A1 Oct. 24, 2013

(30) Foreign Application Priority Data
Dec. 28, 2010 (JP) .................... 2010-293933

(51) Int. Cl.
G11C 29/00 (2006.01)
G06F 11/08 (2006.01)
(Continued)

(52) U.S. Cl.
CPC ............... *G06F 11/08* (2013.01); *G11C 15/04* (2013.01); *H03M 7/3088* (2013.01); *G06F 11/1064* (2013.01)

(58) Field of Classification Search
CPC ..... G06F 11/08; G06F 11/1064; G11C 15/04; H03M 7/3008
See application file for complete search history.

(56) References Cited

U.S. PATENT DOCUMENTS

| 5,883,588 A | 3/1999 | Okamura |
| 6,667,699 B2 * | 12/2003 | Jones et al. ............ 341/51 |

FOREIGN PATENT DOCUMENTS

| JP | 63177242 | 7/1988 |
| JP | 05252047 | 9/1993 |

(Continued)

OTHER PUBLICATIONS

"International Application No. PCT/JP2011/072891 Search Report", May 7, 2012, 2 pages.
(Continued)

*Primary Examiner* — Sam Rizk
(74) *Attorney, Agent, or Firm* — DeLizio Gilliam, PLLC

(57) ABSTRACT

Data is compressed using content addressable memory without disruption despite error using a plurality of content addressable memories to detect sequentially repeating data elements of the data. Compression information is generated for each sequence of repeating data elements that repeat for at least a compression threshold without any one of the plurality of content addressable memories generating an indication of an error for a matching content addressable memory entry. Individual data elements are output for each of the data elements that do not repeat for the compression threshold. Compression information is generated for each sequence of repeating data elements that repeat for at least the compression threshold and then generating a currently searched data element that matches the repeating data elements when any one of the plurality of content addressable memories generates an indication of an error for a content addressable memory entry that matches the currently searched data element.

20 Claims, 12 Drawing Sheets

(51) Int. Cl.
*G11C 15/04* (2006.01)
*H03M 7/30* (2006.01)
*G06F 11/10* (2006.01)

(56) References Cited

FOREIGN PATENT DOCUMENTS

| | | |
|---|---|---|
| JP | 07114577 | 5/1995 |
| JP | 08147986 | 6/1996 |
| JP | 08242176 | 9/1996 |
| JP | 2005175940 | 6/2005 |
| JP | 2010268146 | 11/2010 |
| WO | 2004012338 | 2/2004 |
| WO | 2010050282 | 5/2010 |

OTHER PUBLICATIONS

"International Application No. PCT/JP2011/075170 Search Report", May 7, 2012, 2 pages.
Miyatake, Hisatada, "High-Speed Parallel Content-Addressable Memory (CAM) Having Parity Check Function during Search", ProVISION No. 67; English Abstract Nov. 2010, p. 87.
Pagiamtzis, Kostas et al., "A Soft-Error Tolerant Content-Addressable Memory (CAM) Using an Error-Correcting-Match Scheme", IEEE 2006 Custom Intergrated Circuits Conference (CICC) 2006, pp. 301-304.
Rabaey, Jan M. et al., "Design Project: 512-Word Content-Addressable Memory", Digital Integrated Circuits—A Design Perspective 2/e, Chapters 6 and 12 Prentice Hall 2003, 5 pages.
Yang, Ren-Yang et al., "High-Throughput Data Compressor Designs Using Content Addressable Memory", 1995, pp. 147-150.

* cited by examiner

[Figure 6]

PARITY ERROR RECOVERY METHOD FOR STRING SEARCH CAM

TECHNICAL FIELD

The present inventive subject matter relates to computing systems and, in particular, to handling parity errors during data compression.

BACKGROUND

Deflate compression (RFC 1951) is a compression method on which ZLIB (RFC 1950) and GZIP (RFC 1952) are based and uses LZ77 encoding. In the LZ77 encoding, a repeated portion of a character string in data is searched for and the character string is replaced with the position and length of the repeated portion to compress the data. For example, if a character string, "IBM is IBM", is encoded using the LZ77 encoding, the second occurrence of "IBM" is compressed since that portion is a repeated portion. Specifically, the portion is compressed by replacing it with a code such as "7, 3" which indicates that "a length of three characters that appears seven characters before is repeated". In this case, the longer the repeated portion, the higher the compression ratio is.

In the specifications for deflate compression, up to 32 KB (kilobytes) of data preceding a character string is searched for a repeated occurrence of that character string, which uses large amounts of processing power for comparing character strings for searching for repeated occurrences of character strings.

Accordingly, handling this processing by software uses a large amount of processing time. Hashing can be used to reduce the search time by software. However, if many character strings have the same hash value, hashing can discard some of the character strings. That is, considering processing time and buffer capacity, it is difficult to find all of the character strings without omission.

In some character string search methods, each of the bits that make up a character is held in a memory cell of a content addressable memory (hereinafter "CAM"). Because these memory cells are more densely packed, the memory cells can be more prone to errors called soft errors due to the influence of cosmic rays or other noise. Some conventional memories have error detection circuits such as parity check circuits in order to improve the reliability. CAMs can be designed to include a parity bit for CAMs to perform parity error detection.

Generally, if an error occurs in a memory cell of a CAM, processing halts at that point in time. To avoid such a halt, it is actually desirable that an error correction circuit such as ECC be incorporated. However, a CAM needs an ECC circuit to be incorporated for each byte, which increases the circuit size too much.

SUMMARY

The present inventive subject matter provides a device that processes a first partial data element string of a data element string on the basis of the position of a second partial data element string of the data element string and includes a content addressable memory storing each of a plurality of data elements constituting at least a part of the data element string in an address corresponding to the position of the data element in the data element string and, if a match data element that matches a search data element is stored as one of the plurality of data elements when the search data element is provided, outputting an address at which the match data element is stored, a first path providing an input data element to the content addressable memory as the search data element and outputting the address output from the content addressable memory, a second path outputting an input data element without providing the input data element to the content addressable memory as the search data element, and a processing part processing the first partial data element string by using the position of the second partial data element string determined by the address output from the first path if no error occurs in a match data element that matches the search data element when the first path provides a particular data element included in the first partial data element string to the content addressable memory as the search data element in response to an input of the particular data element, processing the first partial data element string by using the particular data element output from the second path if an error occurs in a match data element that matches the search data element.

The second path may have a pipeline configuration that outputs the data element in synchronization with the output of the address from the first path.

The present inventive subject matter also provides a device that replaces a first partial data element string of a data element string with information indicating the position and length of a second partial data element string of the data element string to compress the data element string and includes a content addressable memory storing each of a plurality of data elements constituting at least a part of the data element string in an address corresponding to the position of the data element in the data element string and, if a match data element that matches a search data element is stored as one of the plurality of data elements when the search data element is provided, outputting an address at which the match data element is stored, a generation circuit generating, on the basis of the address output from the content addressable memory, string presence information indicating that a string of match data elements that matches a string of search data elements previously provided is stored and row address information indicating an address at which the string of the match data elements is stored if the string of the match data elements is stored in the content addressable memory when the search data element is provided to the content addressable memory, a first path providing an input data element to the content addressable memory as the search data element and outputting the string presence information and the row address information generated by the generation circuit, a second path outputting an input data element without providing the input data element to the content addressable memory as the search data element, and a processing part performing a process for replacing the first partial data element string with information indicating the position and length of the second partial data element string determined by the number of successive outputs of the string presence information from the first path and the row address information output from the first path if one condition that no error occurs in a match data element that matches the search data element is satisfied when the first path provides a particular data element included in the first partial data element string to the content addressable memory as the search data element in response to an input of the particular data element, and performing a process using the particular data element output from the second path to prevent a part of the first partial data element string from being compressed if an error occurs in a match data element that matches the search data element.

The processing part may perform the process for replacing with information indicating the position and length of the second partial data element string that is determined by the number of successive outputs and the row address information output from the first path if a further condition that the number of successive outputs of the string presence information from the first path exceeds a predetermined number is satisfied in addition to the one condition when the first path provides the particular data element to the content addressable memory as the search data element.

The processing part may perform a process using the particular data element output from the second path to prevent a part of the first partial data element string from being compressed if the number of successive outputs of the string presence information from the first path does not exceeds a predetermined number when the first path provides the particular data element to the content addressable memory as the search data element.

The second path may have a pipeline configuration that outputs the data element in synchronization with the output of the string presence information and the row address information from the first path.

The present inventive subject matter also provides a device that replaces a first partial data element string of a data element string with information indicating the position and length of a second partial data element string of the data element string to compress the data element string and includes a content addressable memory storing each of a plurality of data elements constituting at least a part of the data element string and a parity element corresponding to the data element in an address corresponding to the position of the data element in the data element string and, if a match data element that matches a search data element is stored as one of the plurality of data elements when the search data element is provided, outputting an address at which the match data element is stored, a generation circuit generating, on the basis of the address output from the content addressable memory, string presence information indicating that a string of match data elements that matches a string of search data elements previously provided is stored and row address information indicating an address at which the string of the match data elements is stored if the string of the match data elements is stored in the content addressable memory when the search data element is provided to the content addressable memory, a determination circuit determining whether or not a value of the parity element stored at an address at which a match data element that matches the search data element is stored is generated from the search data element if the match data element is stored in the content addressable memory when the search data element is provided to the content addressable memory, a first path providing an input data element to the content addressable memory as the search data element and outputting the string presence information and the row address information generated by the generation circuit, a second path outputting an input data element without providing the input data element to the content addressable memory as the search data element, and a processing part performing a process for replacing the first partial data element string with information indicating the position and length of the second partial data element string determined by the number of successive outputs and the row address information output from the first path if both of a condition that the determination circuit determines that a value of the parity element is generated and a condition that the number of successive outputs of the string presence information from the first path exceeds a predetermined number are satisfied when the first path provides a particular data element included in the first partial data element string to the content addressable memory as the search data element in response to an input of the particular data element, and performing a process using the particular data element output from the second path to prevent the part of the particular data element of the first partial data element string from being compressed if at least one of a condition that the determination circuit determines that a value of the parity element is not generated and a condition that the number of successive outputs of the string presence information from the first path does not exceeds the predetermined number is satisfied.

The present inventive subject matter also provides a method for processing a first partial data element string of a data element string on the basis of the position of a second partial data element string of the data element string. The method includes a content addressable memory storing each of a plurality of data elements constituting at least a part of the data element string in an address corresponding to the position of the data element in the data element string and, if a match data element that matches a search data element is stored as one of the plurality of data elements when the search data element is provided, outputting an address at which the match data element is stored, a first path providing an input data element to the content addressable memory as the search data element and outputting the address output from the content addressable memory, and a second path outputting an input data element without providing the input data element to the content addressable memory as the search data element, and includes the steps of: determining whether or not an error has occurred in a match data element matching the search data element when the first path provides a particular data element included in the first partial data element string to the content addressable memory as the search data element in response to an input of the particular data element; and if it is determined that no error has occurred in the match data element, using the address output from the first path to process the first partial data element string and, if it is determined that an error has occurred in the match data element, using the particular data element output from the second path to process the first partial data element string.

BRIEF DESCRIPTION OF THE DRAWINGS

FIG. 10-1 is a flowchart illustrating an example operation of a data compression controller in an embodiment of the present inventive subject matter;

FIG. 10-2 is a flowchart illustrating an example operation of the data compression controller in an embodiment of the present inventive subject matter.

DESCRIPTION OF EMBODIMENT(S)

Embodiments of the present inventive subject matter will be described below in detail with reference to the accompanying drawings.

Figure 1:
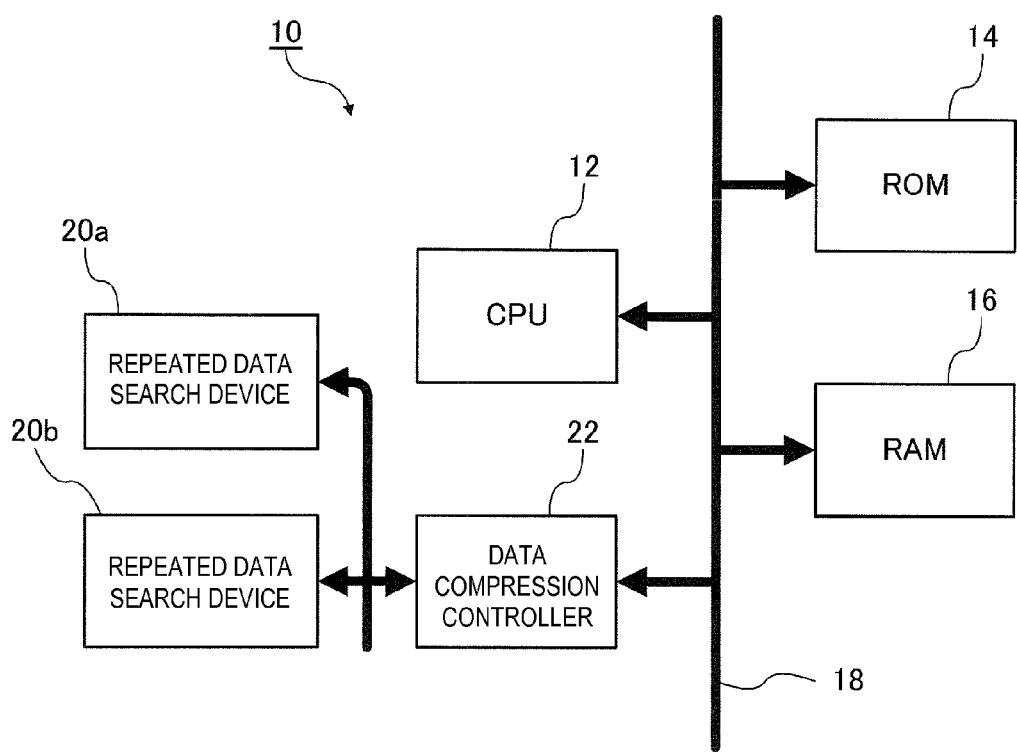
FIG. 1 is a diagram illustrating an example configuration of a computing system to which an embodiment of the present inventive subject matter is applied.

FIG. 1 illustrates (a portion of) a computing system 10. The computing system 10 includes a CPU 12, a ROM 14, and RAM 16, which are interconnected through a bus 18.

The computing system 10 also includes a plurality of repeated data search devices 20a, 20b, . . . according to the present embodiment, which are connected to the bus 18 through a data compression controller 22 that controls operations of the repeated data search devices. Note that P+1 repeated data search devices are provided in the present embodiment. The P+1 repeated data search devices will be hereinafter collectively referred to as the "repeated data search devices 20" and a configuration of the repeated data search devices 20 will be described. The individual repeated data search devices will be distinguished from one another by referring to them as "block 0" to "block P".

Figure 2:
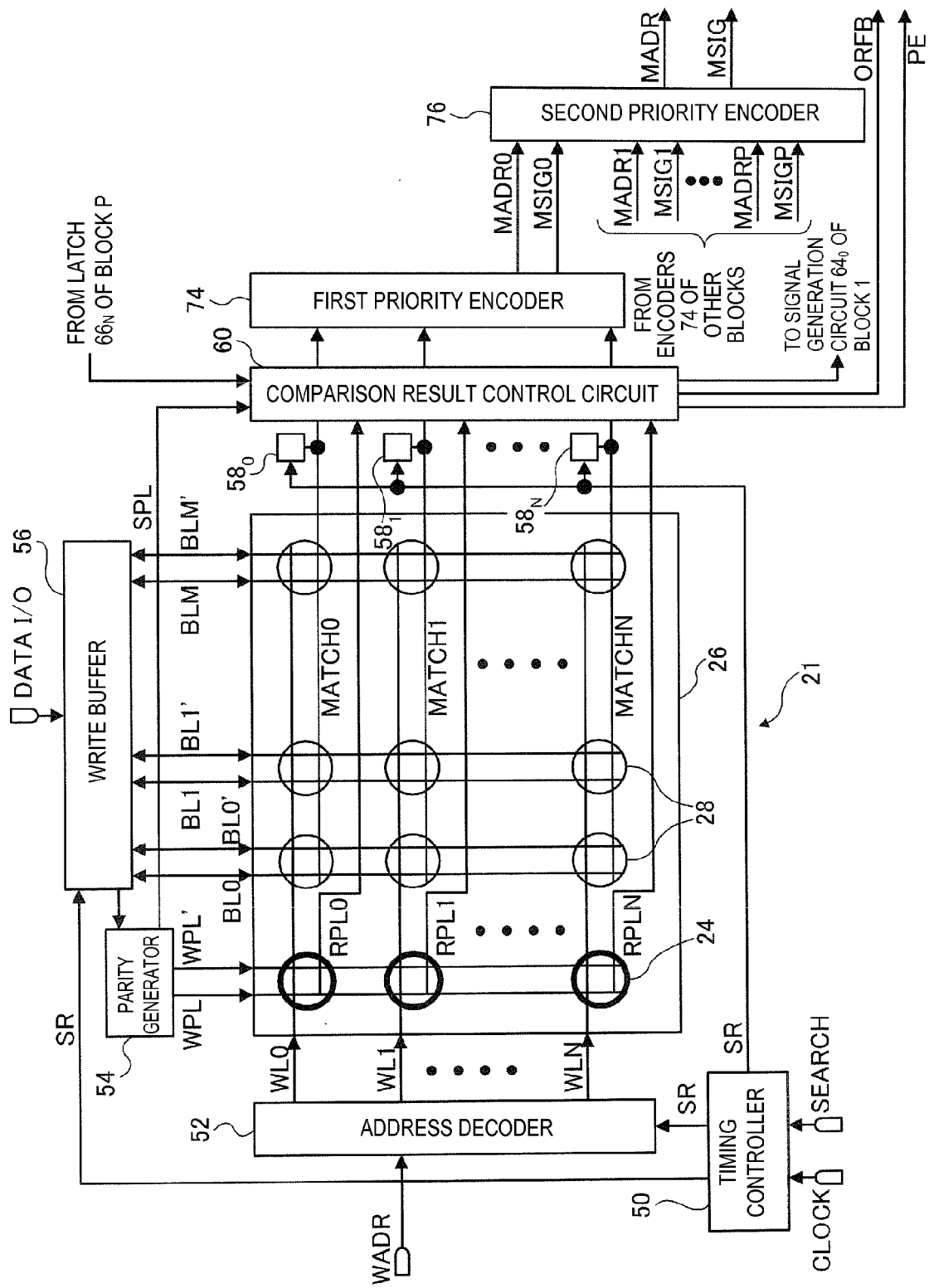
FIG. 2 is a block diagram illustrating an example configuration of a repeated data search circuit in an embodiment of the present inventive subject matter.

FIG. 2 is a diagram illustrating a repeated data search circuit 21 which comprises a part of the repeated data search devices 20 in the present embodiment.

The repeated data search circuit 21 includes a CAM cell array 26 having a matrix of content addressable memory cells 28 indicated by the thin circles in the figure. The CAM cell array 26 has a matrix of N+1 word lines WL0 to WLN, a matrix of N+1 match lines MATCH0 to MATCHN, and a matrix of M+1 pairs of bit lines BL0, BL0' to BLM, BLM'. Each of the CAM cells 28 is connected to any one of the word lines WL0 to WLN, any one of the match liens $MATCH_0$ to $MATCH_N$, and any one of the pairs of bit lines $BL_0$, $BL_{0'}$ to $BL_M$, $BL_{M'}$.

Figure 3:
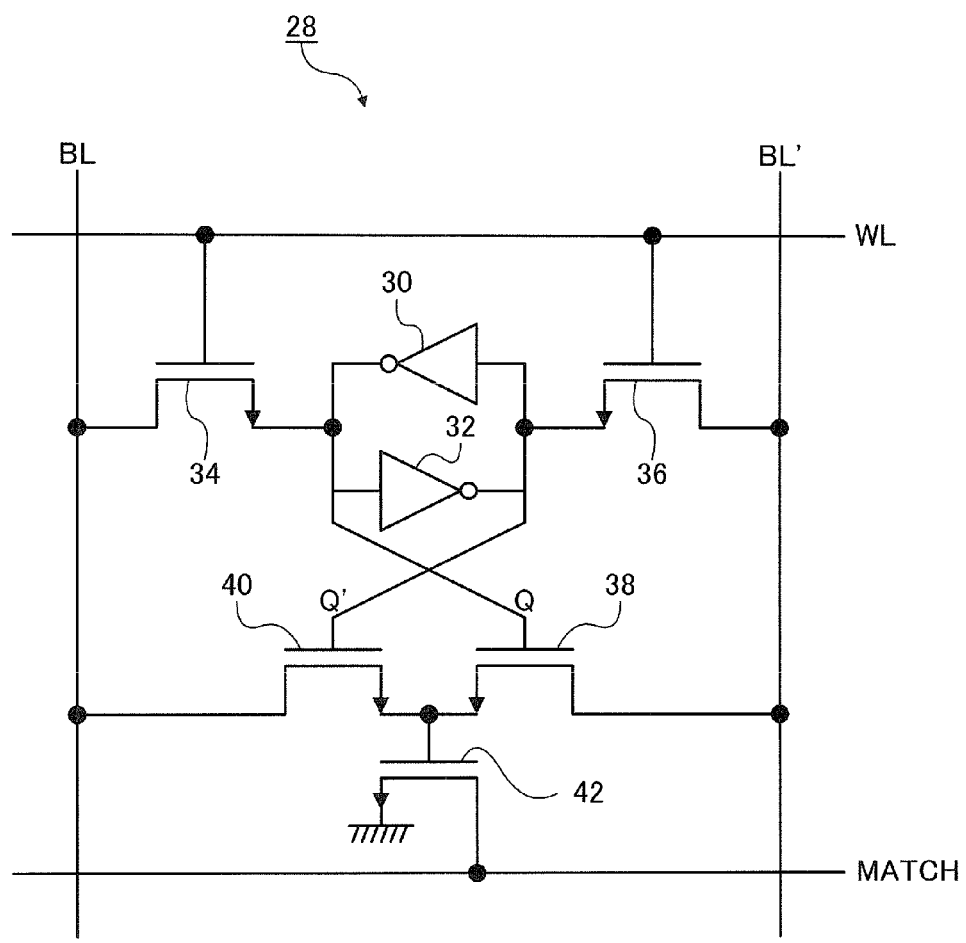
FIG. 3 is a circuit diagram illustrating an example configuration of a content addressable memory cell.

As illustrated in FIG. 3, each CAM cell 28 includes two NOT circuits 30 and 32. Each of the NOT circuits 30 and 32 has an input terminal connected to an output terminal of the other of the NOT circuits 30 and 32. The loop of the NOT circuits 30 and 32 constitutes a memory circuit (SRAM) which stores 1 bit of data. The output terminal of the NOT circuit 30 is connected to the source of an N-MOSFET 34, the output terminal of the NOT circuit 32 is connected to the source of an N-MOSFET 36, and the gate of each of the N-MOSFETs 34 and 36 is connected to a word line WL. The drains of the N-MOSFETs 34 and 36 are connected to bit lines BL and BL', respectively.

Here, when 1 bit of data is to be written in the CAM cell 28, the world line WL is driven high, the bit line BL is driven to a level corresponding to the data D to be written (high when D is "1" or low when D is "0"), and the bit line BL' is driven to the level that is the inverse of that of the bit line BL (low when the bit line BL is high or high when the bit line BL is low). As a result, the N-MOSFETs 34 and 36 turn on and the data provided through the bit line BL or BL' is held in the loop of the NOT circuits 30 and 32.

The output terminal of the NOT circuit 30 is connected to the gate of an N-MOSFET 38 and the output terminal of the NOT circuit 32 is connected to the gate of an N-MOSFET 40. Note that data Q' is the inverse of the data D and is output from the NOT circuit 32. Data Q is the inverse of data Q' and is output from the NOT circuit 30. The drains of the N-MOSFETs 38 and 40 are connected to the bit lines BL' and BL, respectively, and the sources are connected to the gate of the N-MOSFET 42. The drain of the N-MOSFET 42 is connected to a match line MATCH and the source is grounded.

Note that, M+1 CAM cells 28, for example, are connected to the same word line and the same match line in the present embodiment so that M+1 bits of data can be stored in the plurality of CAM cells 28 connected to the same word and match lines. CAM cells connected to the same word lines and match lines will hereinafter be referred to as a CAM cell row. An address is assigned to each CAM cell row in the CAM cell array 26.

N+1 parity memory cells 24 indicated by thick circles in FIG. 2 are arranged in a column in the CAM cell array 26. N+1 read parity lines RPL0 to RPLN and one pair of write parity lines WPL and WPL' are provided in the CAM cell array 26 and each parity memory cell 24 is connected to any one of the word lines WL0 to WLN and any one of the read parity lines RPL0 to RPLN and to the pair of write parity lines WPL and WPL'.

Figure 4:
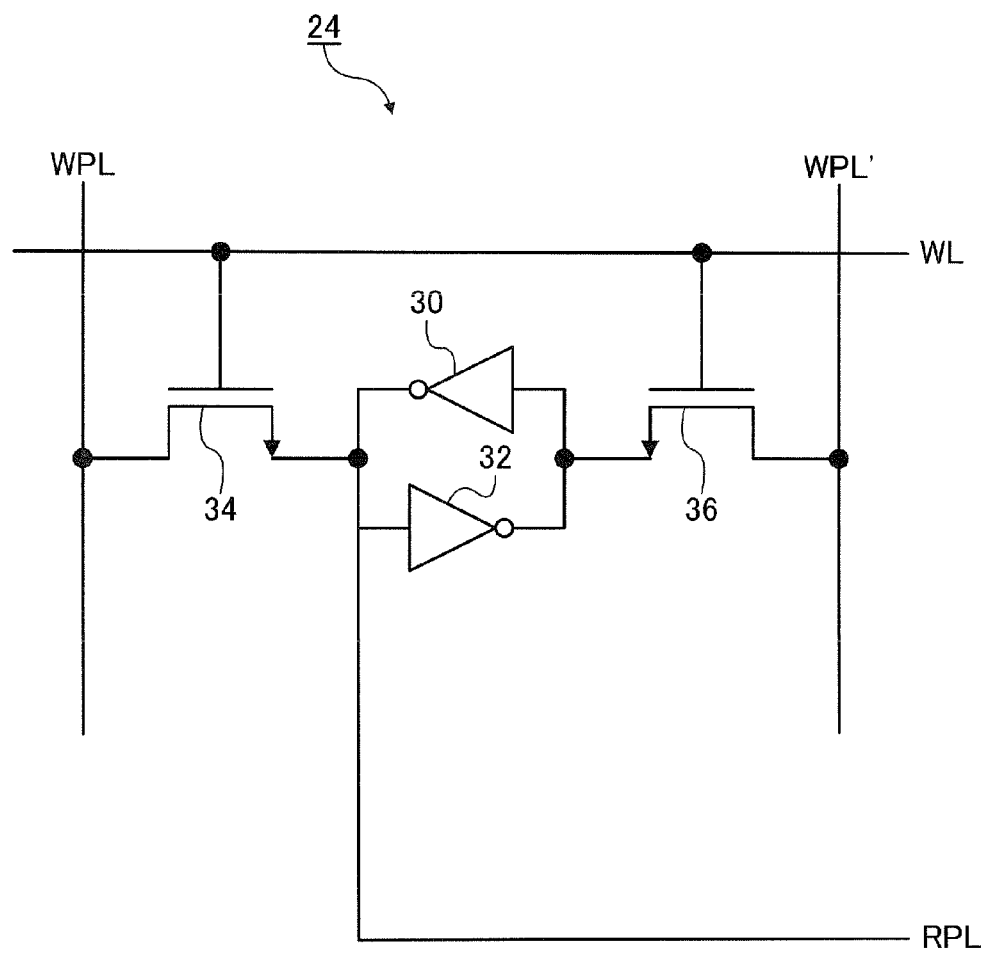
FIG. 4 is a circuit diagram illustrating an example configuration of a parity memory cell.

The N+1 parity memory cells 24 have the same configuration. As illustrated in FIG. 4, each parity memory cell 24 has a configuration similar to that of the CAM cell 28 in FIG. 3, except that the parity memory cell 24 does not have the N-MOSFETs 38, 40 and 42 included in the CAM cell 28 and the output terminal of the NOT circuit 30 is connected to a read parity line RPL so that data held in the loop of the NOT circuits 30 and 32 are directly read.

Note that an address is assigned to each parity memory cell 24 in the CAM cell array 26.

Returning to FIG. 2, the repeated data search circuit 21 includes a timing controller 50. The timing controller 50 is connected to the data compression controller 22 depicted in FIG. 1. When a search instruction SEARCH is input from the data compression controller 22 into the timing controller 50, the repeated data search circuit 21 enters a "search" mode in which the repeated data search circuit 21 repeatedly compares input search data with data stored in each CAM cell row of the CAM cell array 26 and then writes the search data in any of the CAM cell rows of the CAM cell array 26.

A system clock CLOCK from the data compression controller 22 is input into the timing controller 50 and the timing controller 50 generates and outputs a clock SR that is in synchronization with the system clock CLOCK. The clock SR is output to a write buffer 56 connected to the timing controller 50.

The write buffer 56 is connected to the data compression controller 22 and search data is sequentially input in the write buffer 56 from the controller 22. The pairs of bit lines BL0, BL0' to BLM, BLM' are connected to the write buffer 56 so that the write buffer 56 holds input search data and changes the levels of the bit line pairs BL0, BL0' to BLM, BLM' (drives the bit line pairs) according to values of the held search data in synchronization with the clock SR input from the timing controller 50. While the write buffer 56 is driving each bit line pair according to given search data, data stored in each CAM cell row is compared with the given search data and the given search data is written in a given CAM cell row.

A parity generator 54 is connected to the write buffer 56 and search data is sequentially input in the parity generator 54 from the write buffer 56. The pair of write parity lines WPL and WPL' are connected to the parity generator 54. The parity generator 54 calculates a parity bit on the basis of input search data and changes the level of the write parity line pair WPL and WPL' (drives the bit line pair) according to the calculated parity bit in synchronization with the clock SR input from the timing controller 50. While the parity generator 54 is driving the bit line pair according to the parity bit, the parity bit is written in a predetermined parity memory cell 24. A search parity line SPL is also connected to the parity generator 54 and the parity generator 54 changes the level of the search parity line SPL according to the calculated parity bit.

An address decoder 52 is connected to the timing controller 50 and the clock SR is output to the address decoder 52 as well. The address decoder 52 is connected to the data compression controller 22 and the address of a CAM cell row (a write address WADR) in which search data is to be written from the data compression controller 22 is specified. The word lines WL0 to WLN are connected to the address decoder 52. In synchronization with the clock SR, more specifically, at a timing in a period during which the write buffer 56 is driving each bit line pair according to given search data after comparison of the given search data with the data stored in each CAM cell row, a word line corresponding to a specified write address WADR is asserted (enabled) to write the given search data into a CAM cell row corresponding to the specified address and a parity bit calculated from the given search data is written in a parity memory cell 24 corresponding to the specified address.

N+1 match line controllers $58_0$ to $58_N$ connected to the match lines $MATCH_0$ to $MATCH_N$ are also connected to the timing controller 50 and the clock SR is also output to each of the match line controllers $58_0$ to $58_N$. The match line controllers $58_0$ to $58_N$ charge (precharge) the match lines $MATCH_0$ to $MATCH_N$ to a high level on the basis of the input clock SR prior to comparison of search data with data stored in each CAM cell row. The precharge of the match lines by the match line controllers $58_0$ to $58_N$ is performed in a period between the end of the driving of each bit line pair according to the given search data by the write buffer 56 and the start of driving of each bit line pair according to next search data.

Figure 5:
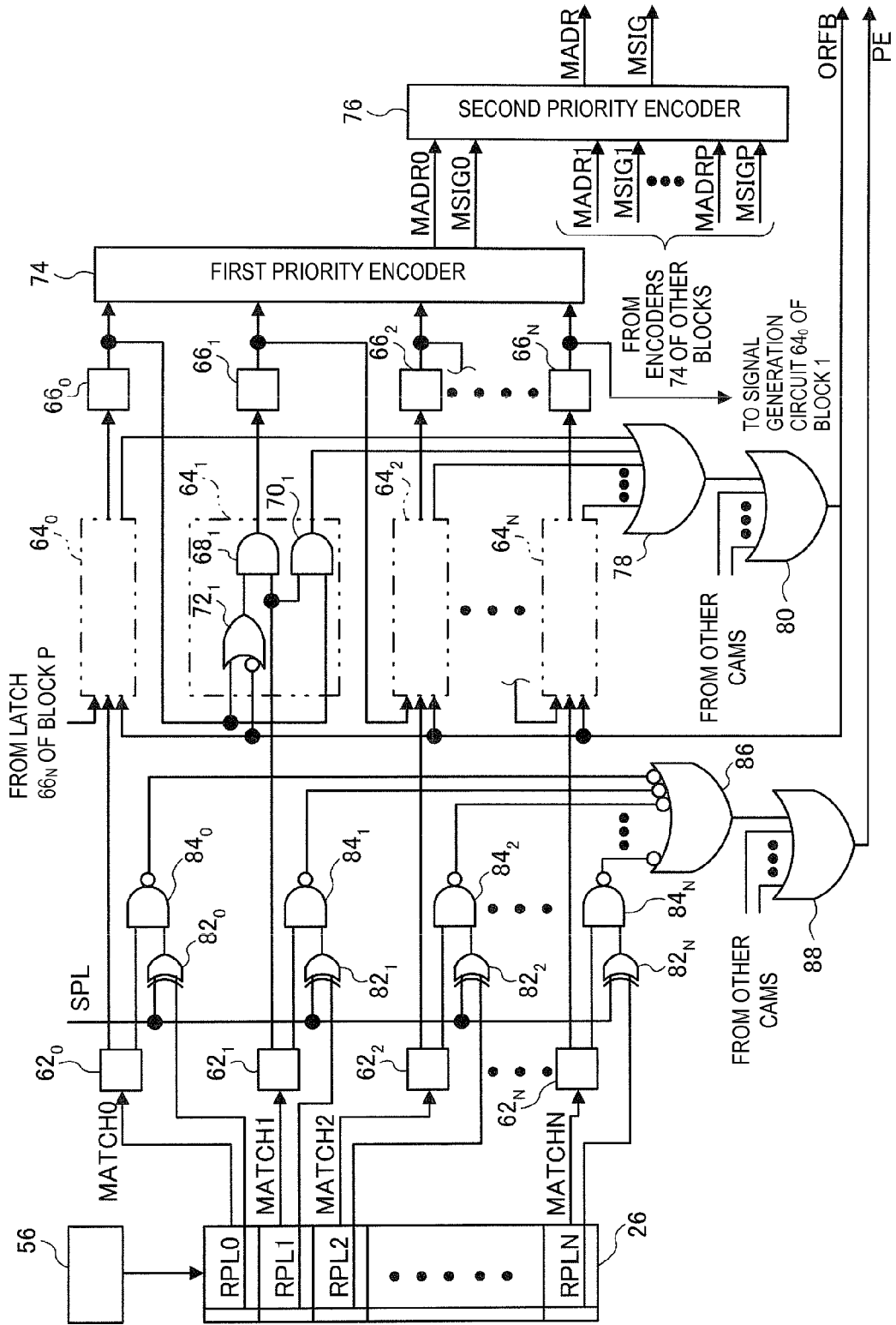
FIG. 5 is a block diagram illustrating an example configuration of a comparison result control circuit in an embodiment of the present inventive subject matter.

The match lines $MATCH_0$ to $MATCH_N$ are connected to a comparison result control circuit 60. As illustrated in FIG. 5, the comparison result control circuit 60 includes latches $62_0$ to $62_N$, signal generation circuits $64_0$ to $64_N$ and latches $66_0$ to $66_N$. Note that the match line controllers $58_0$ to $58_N$ are omitted from FIG. 5. While a detailed configuration of only the signal generation circuit $64_1$ connected to the match line $MATCH_1$ is depicted in FIG. 5 among the signal generation circuits $61_0$ to $64_N$, the other signal generation circuits can have the same or a similar configuration as the signal generation circuit $64_1$ and only a circuit portion associated with the match line $MATCH_1$ in the comparison result control circuit 60 will be described below.

The match line $MATCH_1$ is connected to the input terminal of the latch $62_1$ and an output terminal of the latch $62_1$ is connected to one of two input terminals of each of AND circuits $68_1$ and $70_1$ of the signal generation circuit $64_1$. The output terminal of an OR circuit $72_1$ is connected to the other of the two input terminals of the AND circuit $68_1$ and the other of the two input terminals of the OR circuit $72_1$ and the other of the two input terminals of the AND circuit $70_1$ are connected to the output terminal of a latch $66_0$ in the preceding stage. The output terminal of the AND circuit $68_1$ is connected to the input terminal of a latch $66_1$ and the output terminal of the latch $66_1$ is connected to the input terminals of an OR circuit $72_2$ and an AND circuit $70_2$, not depicted, of a signal generation circuit $64_2$ in the subsequent stage. The output terminal of the latch 661 is also connected to the input terminal of a first priority encoder 74. Furthermore, the output terminal of the AND circuit $70_1$ is connected to one input terminal of an OR circuit 78 and the output terminals of AND circuits $70_0$ and $70_2$ to $70_N$, not depicted, are connected to the other input terminals of the OR circuit 78. The output terminal of the OR circuit 78 is connected to one input terminal of an OR circuit 80 and the output terminal of the OR circuit 78 of another repeated data search circuit 21 is connected to the other input terminal of the OR circuit 80. The output terminal of the OR circuit 80 is connected to the input terminals of OR circuits $72_0$ to $72_N$ of the signal generation circuits $64_0$ to $64_N$ through an inverter, not depicted (only the OR circuit $72_1$ is depicted), and a feedback signal ORFB output from the OR circuit 80 is inverted and input in the OR circuits $72_0$ to $72_N$. The feedback signal ORFB output from the OR circuit 80 is also output to the data compression controller 22 (see also FIG. 2).

Note that FIG. 5 illustrates the comparison result control circuit 60 of the repeated data search circuit 21 of block 0 and one of the two input terminals of the OR circuit $72_0$ of the signal generation circuit $64_0$ is connected to the output terminal of the latch $66_N$ of the comparison result control circuit 60 of block P. Furthermore, the output terminal of the latch $66_N$ of the comparison result control circuit 60 of block 0 is connected to one of the two input terminals of the OR circuit $72_0$ of the comparison result control circuit 60 of block 1 (see also FIG. 2).

An output terminal of the first priority encoder 74 is connected to an input terminal of a second priority encoder 76. The first priority encoder 74 encodes an address corresponding to an input signal that has gone high after a "search" operation among signals input from the latches $66_0$ to $66_N$ of the comparison result control circuit 60, outputs the encoded address as a match address $MADR_0$ to the second priority encoder 76, and also outputs the OR of the signals input from the latches $66_0$ to $66_N$ to the second priority encoder 76 as a match signal $MSIG_0$. Note that if more than one signal is high among the signals input from the latches $66_0$ to $66_N$, the first priority encoder 74 outputs the address of a content addressable memory row that has a higher priority according to a predetermined criterion, for example the lowest address or the address that is closest to the current write address WADR, as a match address $MADR_0$. One reason why the latter address can be output is that the amount of distance information required for compression is small and consequently the compression ratio increases.

Match addresses MADR and match signals MSIG that are output from the first priority encoder 74 of the other repeated data search circuits 21 are also input into input terminals of the second priority encoder 76. The output terminals of the second priority encoder 76 are connected to the data compression controller 22.

The second priority encoder 76 can have a configuration similar to that of the first priority encoder 74. The second priority encoder 76 outputs, to the data compression controller 22, an address that has a higher priority according to a predetermined criterion among addresses $MADR_0$ to $MADR_P$ input from a plurality of first priority encoders 74 that have $MSIG_0$ to $MSIG_P$ at the high level, for example the lowest address, plus the address of that block (the address assigned to each of the plurality of repeated data search devices), or the address that is closest to the current write address WADR as a match address MADR. The second priority encoder 76 also outputs a signal representing the OR of match signals $MSIG_0$ to $MSIG_P$ input from the plurality of first priority encoders 74 to the data compression controller 22 as a match signal MSIG.

The comparison result control circuit 60 also includes EXOR circuits $82_0$ to $82_N$ and NAND circuits $84_0$ to $84_N$. Only a circuit portion associated with the read parity line $RPL_1$ among these circuits will be described below.

The read parity line $RPL_1$ is connected to one of the two input terminals of the EXOR circuit $82_1$ and a search parity line SPL is connected to the other of the input terminals of the EXOR circuit $82_1$. The output terminal of the EXOR circuit $82_1$ is connected to one of the two input terminals of a NAND circuit $84_1$ and the other of the two input terminals of the NAND circuit 841 is connected to the output terminal of the latch $62_1$. The output terminal of the NAND circuit $84_1$ is connected to one input terminal of an OR circuit 86 through an inverter and the output terminals of NAND circuits $84_0$ and $84_2$ to $84_N$ are connected to the other input terminals of the OR circuit 86 through an inverter. The output terminal of the OR circuit 86 is connected to one input terminal of an OR circuit 88 and the output terminals of OR circuits 86 of other repeated data search circuits 21 are connected to the other input terminals of the OR circuit 88. A parity error signal PE output from the OR circuit 88 is output to the data compression controller 22 (see also FIG. 2).

A comparison operation in the repeated data search circuit 21 will be described first as an operation of the present embodiment. When data to be compressed (original data) is compressed, the data compression controller 22 takes out a unit or portion having a predetermined bit length from the original data in sequence as search data as will be described later and outputs the search data to the repeated data search circuit 21 in sequence along with a search instruction SEARCH and a write address WADR.

When the search instruction SEARCH is input in the repeated data search circuit 21, the timing controller 50 in the repeated data search circuit 21 outputs the clock SR to the write buffer 56, the address decoder 52 and the match line controllers $58_0$ to $58_N$ and the match line controllers 58 precharge the match lines $MATCH_0$ to $MATCH_N$ in preparation for comparison operation in the CAM cell array 26, and the write buffer 56 holds input search data and drives the bit line pairs $BL_0$, $BL_0'$ to $BL_M$, $BL_M'$ according to the search data.

In each CAM cell 28 of the CAM cell array 26, the N-MOSFET 38 is on when data Q output from the NOT circuit 30 is "1" (high) or the N-MOSFET 40 is on when data Q' output from the NOT circuit 32 is "1". Accordingly, if the data Q (Q') held in the loop of the NOT circuit 30 and 32 matches data D (D') provided through the bit line pairs BL, BL', the N-MOSFET 42 is not turned on; if they do not match, a current flows from the drain of one of the N-MOSFETs 38 and 40 that is turned on to the source to turn the N-MOSFET 42 on. This lowers the level of the precharged match line MATCH to low (discharge).

The data comparison described above is performed in each CAM cell 28 simultaneously. Since a plurality of CAM cells 28 (CAM cell row) are connected to one match line MATCH, the comparison operation of comparing input character data with character data stored in the CAM cell row is completed almost in the first half of one cycle of the clock SR and each match line is held high only when the N-MOSFETs 42 do not turn on in all of the CAM cells 28 connected to the match line, that is, only when the character data stored in the CAM cell row matches the character data input in the write buffer 56. When they do not match, the match line is driven low.

In the latter half of the clock SR cycle, the word line of the CAM cell row corresponding to the input write address WADR is asserted (enabled) by the address decoder 52 and the search data is written in that CAM cell row. When the write of the search data in the CAM cell row is completed and the word line is driven low and the write buffer 56 stops driving each bit line pair, the match line controller 58 causes the match lines to be precharged again.

The operation described above (comparison operation) is performed in one cycle of the clock SR and is repeated in synchronization with inputs of search data, a search instruction SEARCH and a write address WADR from the data compression controller 22.

During the comparison operation, the repeated data search circuit 21 also checks the parity of the character data stored in each CAM cell row. The EXOR circuit 82 compares the level of the search parity line SPL output from the parity generator 54 and the level of the read parity line RPL output from the parity memory cell 24 and outputs a low-level signal if they match or a high-level signal if they do not match.

When a signal output from the latch 62 is driven high to indicate a data match and the signal output from the EXOR circuit 82 is driven low to indicate a parity bit match, or when the signal output from the latch 62 is driven low to indicate a data mismatch, the NAND circuit 84 outputs a high-level signal.

On the other hand, when the signal output from the latch 62 is driven high to indicate a data match and the signal output from the EXOR circuit 82 is driven high to indicate a parity bit mismatch, the NAND circuit 84 outputs a low-level signal.

If at least one of the signals output from the NAND circuits $84_0$ to $84_N$ is low, the OR circuit 86 outputs a high-level signal and the OR circuit 88 outputs a parity error signal PE to the data compression controller 22.

Note that the character data in the foregoing description is one example of a data element and the parity bit is one example of a parity element. The signal when ORFB is "1" is one example of string presence information indicating that a string of match data elements that matches a string of search data elements is stored, MADR is one example of row address information indicating an address in which the match data element string that matches the search data element string is stored, and the portion including the signal generation circuits 64, the latches 66, the first priority encoder 74, the second priority encoder 76, the OR circuits 78 and 80 is one example of a generation circuit. Furthermore, the portion including the latches 62, the EXOR circuit 82, the NAND circuit 84, the OR circuits 86 and 88 is one example of a determination circuit.

Figure 6:
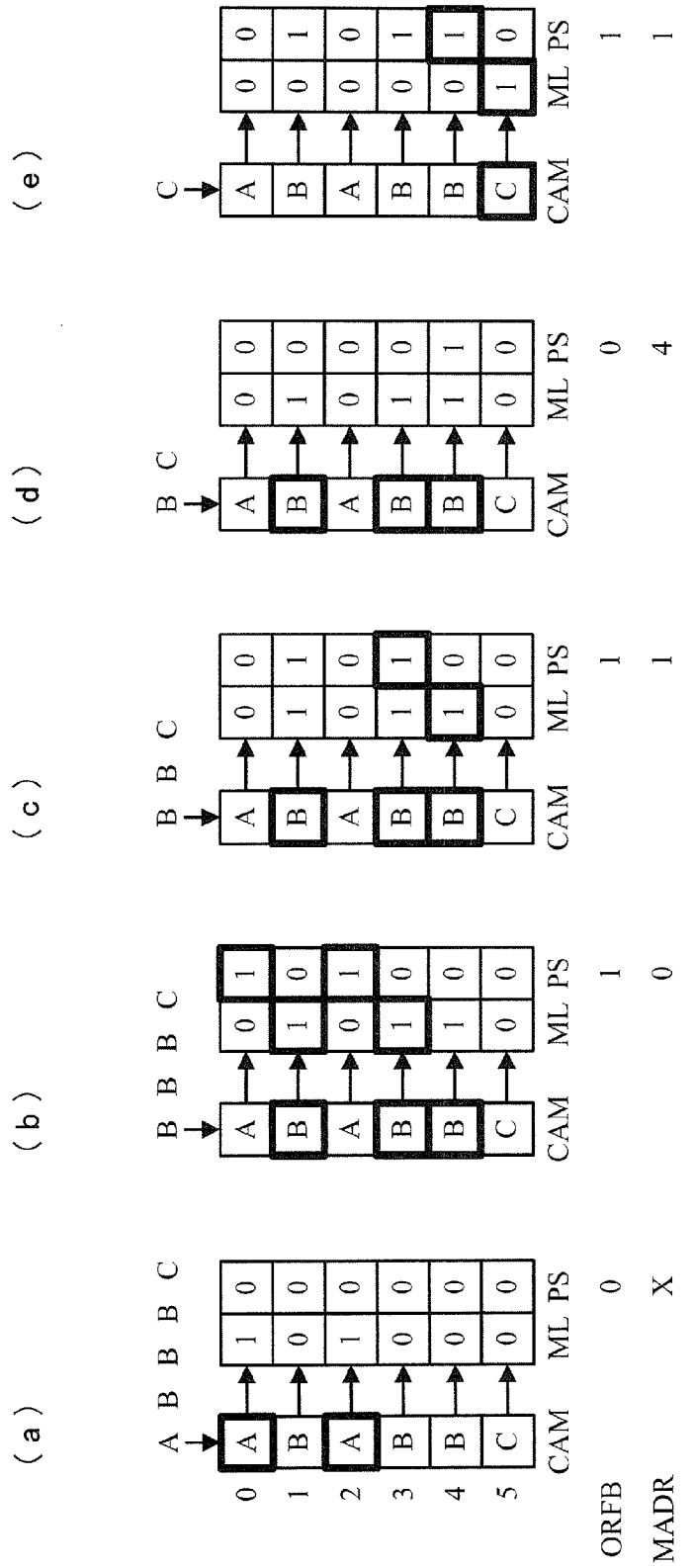
FIGS. 6(a) to 6(e) are conceptual diagrams illustrating an operation of a comparison result control circuit in an embodiment of the present inventive subject matter.

An operation of the comparison result control circuit 60 will be described below with reference to FIG. 6. FIG. 6 illustrates an example in which original data is text data. The text data is a character data string "ABABBC" that is already stored in the CAM cell rows with addresses "0" to "5" in sequence. The illustrated example assumes character data "ABBBC..." is input in sequence as search data. Latches $62_o$ to $62_5$ are referred to as $ML_0$ to $ML_5$, and latches $66_0$ to $66_5$ are referred to as $PS_0$ to $PS_5$. Furthermore, it is assumed in the following description that comparison operations in the other repeated data search devices have resulted in "mismatches" in succession.

As illustrated in FIG. 6(a), when character data "A" is input first as search data, comparisons in the CAM cell rows with addresses "0" and "2" (indicated by thick-line boxes in FIG. 6) result in a "match", the match lines other than match lines MATCH0 and MATCH2 among the match lines MATCH0 to MATCH5 are discharged to low, and only match lines MATCH0 and MATCH2 are held high. The levels of the match lines MATCH0 to MATCH5 are held in the latches $ML_0$ to $ML_5$, respectively, of the comparison result control circuit 60 and are then output to the signal generation circuits $64_0$ to $64_5$ in the next cycle.

As illustrated in FIG. 6(a), since the level held in each of the latches $PS_0$ to $PS_5$ is low at this point in time ("0" in the FIG. 6; the same applies to latches $PS_6$ to $PS_N$, not shown, and the latches $PS_0$ to $PS_N$ in the other blocks), signals output from the AND circuits $70_0$ to $70_5$ are low and a feedback signal $ORFB_0$ output from the OR circuit 78 and a feedback signal ORFB output from the OR circuit 80 are also low. In this way, the fact that only one character is matched is not enough to drive the feedback signal ORFB high. Furthermore, since the feedback signal ORFB is low, outputs from the OR circuits $72_0$ to $72_5$ go high and the levels of signals output from the latches $ML_0$ to $ML_5$ are held unchanged in the latches $PS_0$ to $PS_5$ (see FIG. 6(*b*)).

As illustrated in FIG. 6(*b*), when character data "B" is input as the next search data, comparisons in the CAM cell rows with addresses "1", "3" and "4" result in a "match" and the levels of the match lines (only the match lines MATCH 1, 3 and 4 are high) are held in the latches $ML_0$ to $ML_5$. In the next cycle, outputs from the latches $ML_1$, $ML_3$ and $ML_4$ go high and outputs from the latches $PS_0$ and $PS_2$ (that is, the latches PS in the stage preceding the latches $ML_1$ and $ML_3$) go high, and therefore signals output from the AND circuits $70_1$ and $70_3$ go high and a feedback signal $ORFB_0$ output from the OR circuit 78 and a feedback signal ORFB output from the OR circuit 80 go high.

In this way, the feedback signal ORFB goes high only when two or more successive characters have matches, that is, only when a data string made up of a plurality of pieces search data input in succession is stored in the CAM cell array 26. Note that if the first priority encoder 74 is configured to output the lowest address as a match address MADR0, the match address MADR0 is address "0" which corresponds to $PS_0$. The value of a lower bit of a match address MADR output from the second priority encoder 76 depends on the value of match addresses input from the other repeated data search devices, and is equal to the value of the match address MADR0 if the data does not have a match in the other repeated data search devices. The values of an upper bit of the match address MADR is equal to the address of the encoder block (the address assigned to each of the plurality of repeated data search devices) in which the match has been found. In this case, the encoder block is the block with address 0 and therefore the values are all 0s.

As illustrated in FIG. 6(*c*), when character data "B" is input as the next search data, the same match lines that have previously become high go high, the levels of the match lines are first held in the latches $ML_0$ to $ML_5$, and then output to the signal generation circuits $64_0$ to $64_5$, respectively. Since only the latch $ML_4$ among the latches $ML_1$, $ML_3$ and $ML_4$ that output high-level signals has the preceding latch PS (i.e., $PS_3$) that also outputs a high-level signal at this time, only a signal output from the AND circuit $70_4$ among signals output from the AND circuits $70_1$, $70_3$ and $70_4$ goes high. Accordingly, the feedback signal ORFB0 output from the OR circuit 78 is held high and the match address MADR0 is address "4" which corresponds to $PS_4$.

Furthermore, since the feedback signal ORFB is held high, a signal equivalent to the AND of an output ML(n, m) from the latch ML with address n and an output PS(n−1, m) of the latch PS in the preceding stage is output to the latch PS with address n, where m is the current cycle. As a result, only the latch $PS_4$ holds the level high.

Then, as illustrated in FIG. 6(*d*), character data "B" is input as the next search data. In this case, the levels of the match lines held in the latches $ML_0$ to $ML_5$ first and then input in the signal generation circuits $64_0$ to $64_5$, respectively, are the same as the levels in the previous cycle. However, for all the latches $ML_1$, $ML_3$ and $ML_4$ that output high-level signals, signals output from their preceding latches PS are low and therefore signals output from the AND circuits $70_0$ to $70_5$ are low and feedback signals ORFB0 and ORFB are also low. When the feedback signal ORFB goes low, signals output from the OR circuits $72_0$ to $72_5$ of the signal generation circuits $64_0$ to $64_5$ go high and therefore the levels of signals output from the latches $ML_1$ to $ML_5$ are held in the latches $PS_0$ to $PS_5$ as is.

As illustrated in FIG. 6(*e*), when character data "C" is input as the next search data, only the match line MATCH5 goes high, the levels of the match lines are first held in the latches $ML_0$ to $ML_5$ and then output to the signal generation circuits $64_0$ to $64_5$, respectively. Since only the latch $ML_5$ outputs a high-level signal and its preceding latch $PS_4$ also outputs a high-level signal, only a signal output from the AND circuit $70_5$ among signals output from the AND circuits $70_0$ to $70_5$ is high. Accordingly, the feedback signal ORFB0 output from the OR circuit 78 is held high and the match address MADR0 is address "1" which corresponds to $PS_1$.

In this way, the repeated data search circuit 21 can search for a match with one character in one clock cycle and enables a fast character string search. Specifically, each time one character is input, the input character can be compared with all of the characters in the CAM cell array 26 simultaneously, which enables a fast search.

Here, consider a situation where a parity error has occurred in the repeated data search circuit 21.

Figure 7:
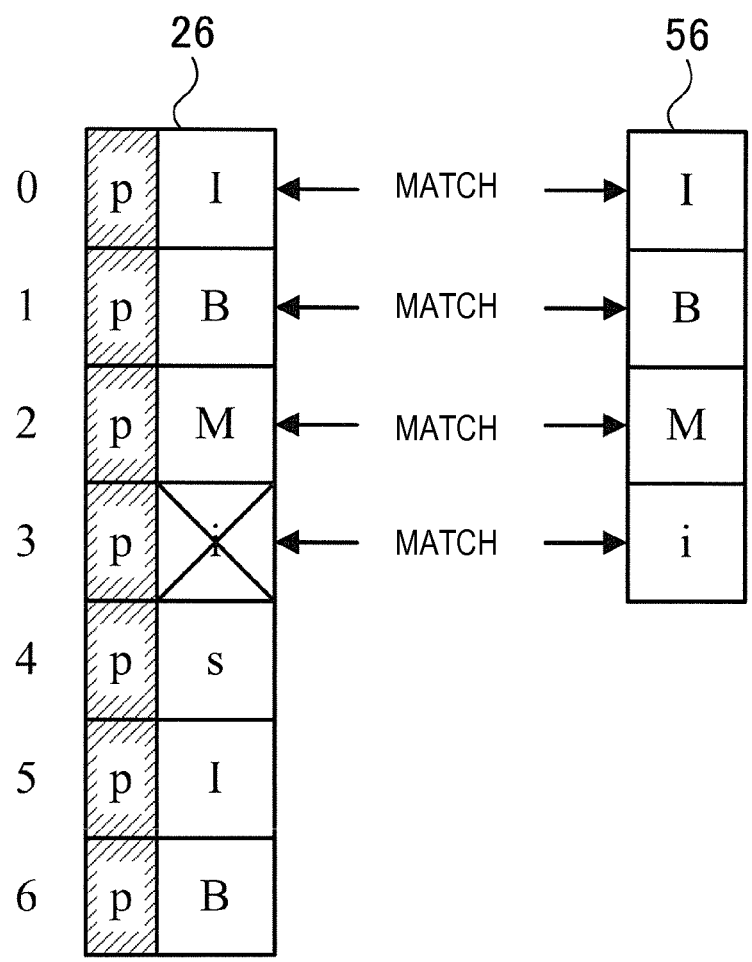
FIG. 7 is a diagram illustrating an example of a parity error that occurs during a character string search.

FIG. 7 illustrates a parity error occurring in a repeated data search operation by a repeated data search circuit 21.

Assume that a character string, "IBMisIB", is input in sequence in a CAM cell array 26. Also assume that parity bits (represented by "P") each of which is associated with each of the characters are stored in the CAM cell array 26. Note that the numbers that appear to the left of the CAM cell array 26 in the figure represent the addresses of the cell rows of the CAM and correspond to the values N of the word lines $WL_N$ (match lines MATCHN and read parity lines RPLN).

When the next character string, "IBMi", is input to the write buffer 56 in the repeated data search circuit 21 in this state, one character at a time, the repeated data search circuit 21 sequentially compares the characters with the character strings stored in the CAM cell array 26. Specifically, when the first character, "I", is input in the write buffer 56, the match line MATCH0 is held high because the character data in address 0 matches the character. When the second character, "B", is input in the write buffer 56, the match line MATCH1 is held high because the character data in address 1 matches the character. When the third character, "M", is input in the write buffer 56, the match line MATCH2 is held high because the character data in address 2 matches the character.

Assume that when the fourth letter, "i", is input in the write buffer 56, a parity error (indicated by the "x" mark in the figure) is detected while the match line MATCH3 is held high. The cause may be that the arrangement of bits of an original, different character has become equal to the arrangement of bits of the character "i" because of a bit-flip caused by noise, for example. Accordingly, the match with the character "i" is unreliable. That is, data in the CAM cell array 26 is unreliable. Therefore, generally, the process can be no longer continued and the process by the repeated data search circuit 21 is aborted at this point in time.

The parity error is reported to the data source to request the data source to resend the data from the beginning and the process is performed again.

If the parity error is a temporary error caused by noise, the resend of the data enables recovery from the error. However, if the error is not a temporary error but a persistent parity error due to a bit corruption or the like of the CAM cell array 26, recovery is impossible because it is a failure of the CAM cell array 26.

A configuration that performs the process again from the beginning in the event of a parity error will be described below.

Figure 8:
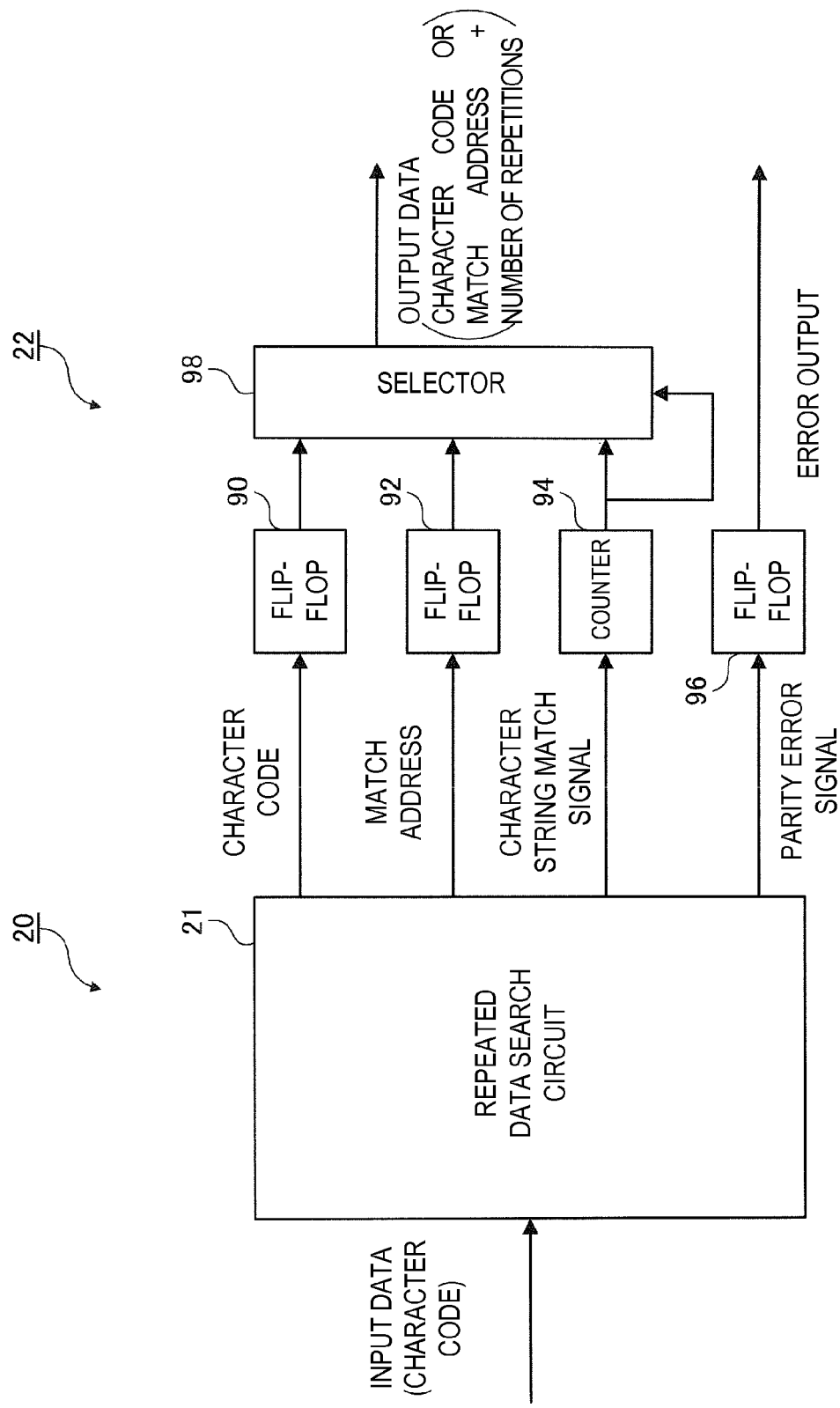
FIG. 8 is a diagram illustrating an example configuration of a conventional repeated data search device and data compression controller.

FIG. 8 is a diagram illustrating (a part of) an example of a configuration of a repeated data search device 20 and a data compression controller 22 configured to perform this.

As illustrated, the repeated data search device 20 includes a repeated data search circuit 21 described with reference to FIGS. 2 to 6. The data compression controller 22 includes a flip-flop 90 that holds character data (a character code) output from the repeated data search circuit 21, a flip-flop 92 that holds a match address (MADR in FIG. 2) output from the repeated data search circuit 21, a counter 94 that counts successive outputs of a character string match signal (ORFB in FIG. 2) from the repeated data search circuit 21, and a flip-flop 96 that holds a parity error signal (PE in FIG. 2) output from the repeated data search circuit 21. The data compression controller 22 further includes a selector 98 that selects and outputs one of character data held by the flip-flop 90 and a set of a match address held by the flip-flop 92 and a count of the counter 94 on the basis of the count of the counter 94.

Operations of the repeated data search device 20 and the data compression controller 22 that have the example configuration are described below.

First, character data is input in the repeated data search circuit 21, one byte at a time. Note that the character data can be input from the data compression controller 22. The repeated data search circuit 21 sequentially writes the input character data in the CAM, compares the input character data with all pieces of character data written so far and, if there is a match piece of character data, outputs a "1" as a character string match signal. However, the repeated data search circuit 21 does not output a "1" as the character string match signal when only one character has a match; it outputs a "1" when two or more successive characters have matches. The repeated data search circuit 21 continues to output a "1" while there is a match with a character of the character string. That is, if a "1" is output during one clock cycle and then a "0" is output in the next clock cycle as the character string match signal, it indicates matches of two characters. If "1"s are output during two clock cycles and a "0" is output in the next clock cycle as the character string match signal, it indicates matches of three characters. In this way, if "1"s are output in K clock cycles and a "0" is output in the next clock cycle, it indicates matches of K+1 characters. Accordingly, the data compression controller 22 can count outputs of the character string match signal with the counter 94 to detect how many characters have matches.

The repeated data search circuit 21 outputs an address of a character data match in the CAM as a match address and the flip-flop 92 holds the match address.

Furthermore, the repeated data search circuit 21 outputs input character data regardless of whether or not there is a match with the character data, and the flip-flop 90 holds character data. The character data is used as uncompressed data if there is not a match with the character data.

When there is not a match with the character data, the selector 98 outputs the character data held in the flip-flop 90; when there is a match with the character data, the selector 98 outputs the match address held in the flip-flop 92 and the count (the number of successive matches with the character data) by the counter 94.

If a parity error occurs in the repeated data search circuit 21, the repeated data search circuit 21 outputs a "1" to the data compression controller 22 as a parity error signal. This allows the data compression controller 22 to know that the character string match signal and the character code are unreliable. In that case, the compression process cannot be continued and therefore data to be compressed is input anew.

To avoid this, the present embodiment enables the reliability of compressed data to be ensured even if a parity error occurs in a repeated data search circuit 21 and the process by the repeated data search circuit 21 halts.

Figure 9:
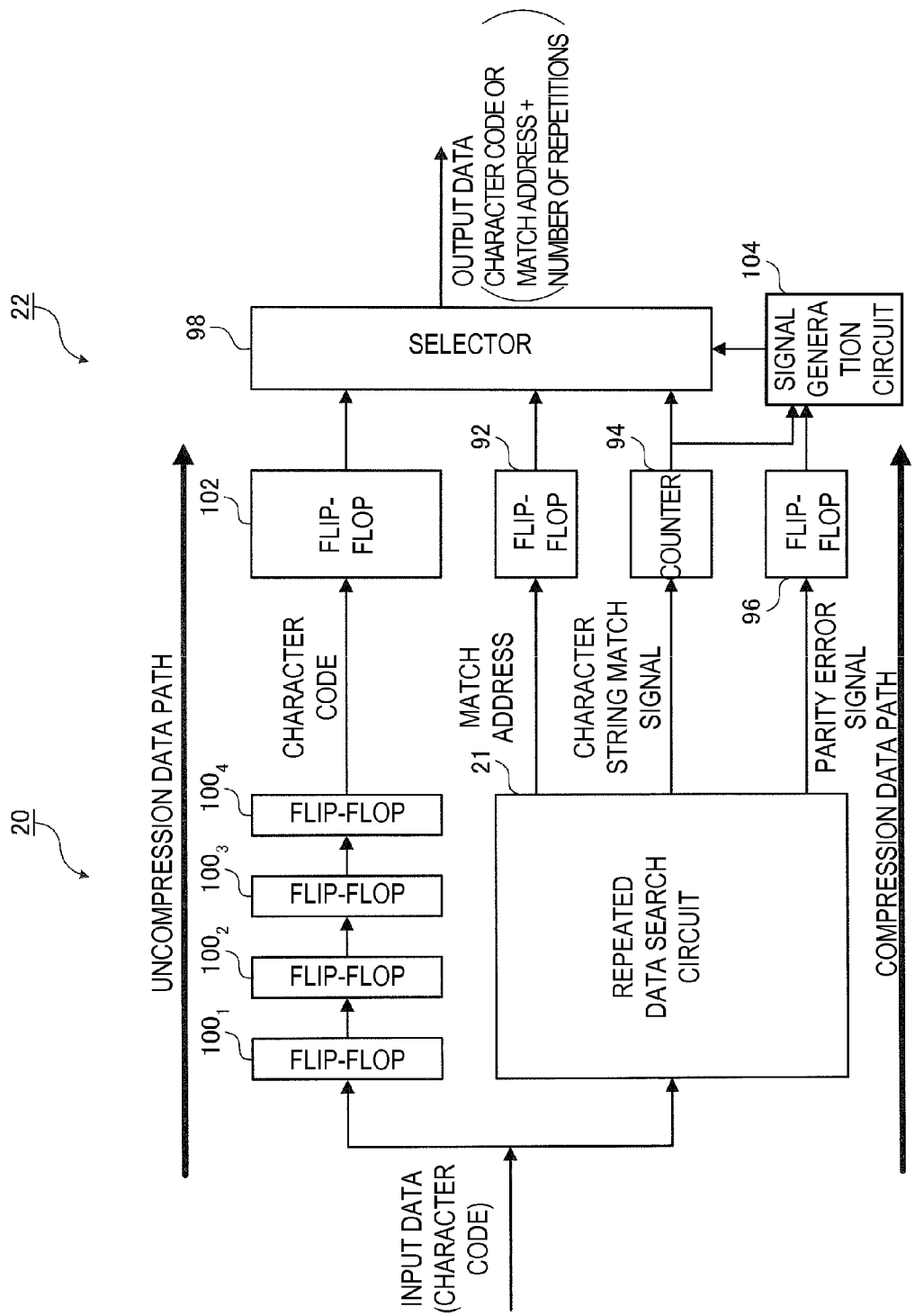
FIG. 9 is a diagram illustrating an example configuration of a repeated data search device and a data compression controller in an embodiment of the present inventive subject matter.

FIG. 9 is a diagram illustrating (a part of) an example configuration of a repeated data search device 20 and a data compression controller 22 in the present embodiment.

As illustrated, the repeated data search device 20 includes flip-flops $100_1$, $100_2$, $100_3$ and $100_4$ in addition to the components in the configuration in FIG. 8. The data compression controller 22 includes, instead of the flip-flop 90 in FIG. 8, a flip-flop 102 that holds character data output from the flip-flop $100_4$ and a signal generation circuit 104 generating a signal to be output to a selector 98 on the basis of a count of the counter 94 and a parity error signal from the flip-flop 96. In the present embodiment, the data compression controller 22 is provided as an example of a processing part.

The compression data path in the figure is an example of a first path for performing compression based on the result of search by the repeated data search circuit 21. The uncompression data path, on the other hand, is an example of a path through which input character data is passed without change. That is, the two paths are provided in the present embodiment to provide redundancy for the repeated data search device 20.

Operations of the repeated data search device 20 and the data compression controller 22 in the present embodiment are described below.

The operations are similar to the operations in FIG. 8 until the repeated data search circuit 21 outputs a match address and a character string match signal, the flip-flop 92 holds the match address, and the counter 94 counts successive matches.

However, in the present embodiment, the flip-flop 102 holds character data that passed through the flip-flops $100_1$, $100_2$, $100_3$ and $100_4$ provided outside the repeated data search circuit 21, rather than character data that passed through the repeated data search circuit 21 as in FIG. 8.

If a parity error occurs in the repeated data search circuit 21 and the repeated data search circuit 21 outputs a parity error signal, the signal generation circuit 104 outputs a signal instructing the selector 98 to select data passing through the uncompression data path to the selector 98. In response to this, the selector 98 selects the character data held in the flip-flop 102 and outputs the character data to a processing part of the data compression controller 22.

On the other hand, if no parity error occurs in the repeated data search circuit 21 and the repeated data search circuit 21 does not output the parity error signal, the signal generation circuit 104 outputs a signal instructing the selector 98 to select data passing through the uncompression data path to the selector 98 if the number of successive match characters is less than or equal to 2. In response to this, the selector 98 selects the character data held in the flip-flop 102 and outputs the character data to the processing part of the data compression controller 22. If the number of successive match characters is greater than or equal to 3, the signal generation circuit 104 outputs a signal instructing the selector 98 to select data passing through the compression data path to the selector 98. In response to this, the selector 98 selects the set of character data held in the flip-flop 92 and the count of the counter 94 and outputs the data and count to the processing part of the data compression controller 22. Note that the reason why data passing through the uncompression data path is selected if the number of successive match characters is less than or equal to 2 and data passing through the compression data path is selected if the number of successive match character is greater than or equal to 3, in this example, is that compression using the position and length of a match character string including two or less successive match characters does not have no compression effect.

Since no parity error has occurred for the first "IBM" in the example in FIG. 7, the repeated data search circuit 21 is properly operating and the selector 98 outputs data, (0, 3), indicating that the three characters "IBM" have matches. Then, a parity error occurs and therefore the selector 98 outputs character data "i" as the fourth character without change. That is, the data (0, 3) and "i" are output in this order.

On the other hand, if no parity error has occurred in the repeated data search circuit 21, the selector 98 outputs (0, 4) because it means that the four characters "IBMi" have matches.

Since the configuration described above is used in the present embodiment, data is not lost even if a parity error occurs in the compression data path, because the original data remains in the uncompression data path. Thus, the present embodiment has the effect that if a parity error occurs, the process does not halt and correct data is output, although the compression ratio may decrease because a portion of the compressed data becomes invalid.

Note that the repeated data search circuit 21 in the compression data path in FIG. 9 is configured to take an input of one character (1 byte) as character data every one clock cycle and process the input character data in a pipeline having four stages. That is, character data is written in the CAM cell array 26 in the first clock cycle, a match of the character data is held in the latch 62 in the second clock cycle, a match of the character string preceding that character data is held in the latch 66 in the third clock cycle, and a match address is held in the flip-flop 92 in the fourth clock cycle. Accordingly, the match address and the character string match signal are output four clock cycles after the input of the character data. Therefore, the uncompression data path has a pipeline configuration with four stages, namely the flip-flops $100_1$, $100_2$, $100_3$ and $100_4$, which is equal to the number of the stages of the compression data path. However, the number of stages is illustrative only; if the number of the stages of the compression data path is K, the uncompression data path generally has K stages.

An operation of the data compression controller 22 in the present embodiment will be described below.

Figures 1, 10:
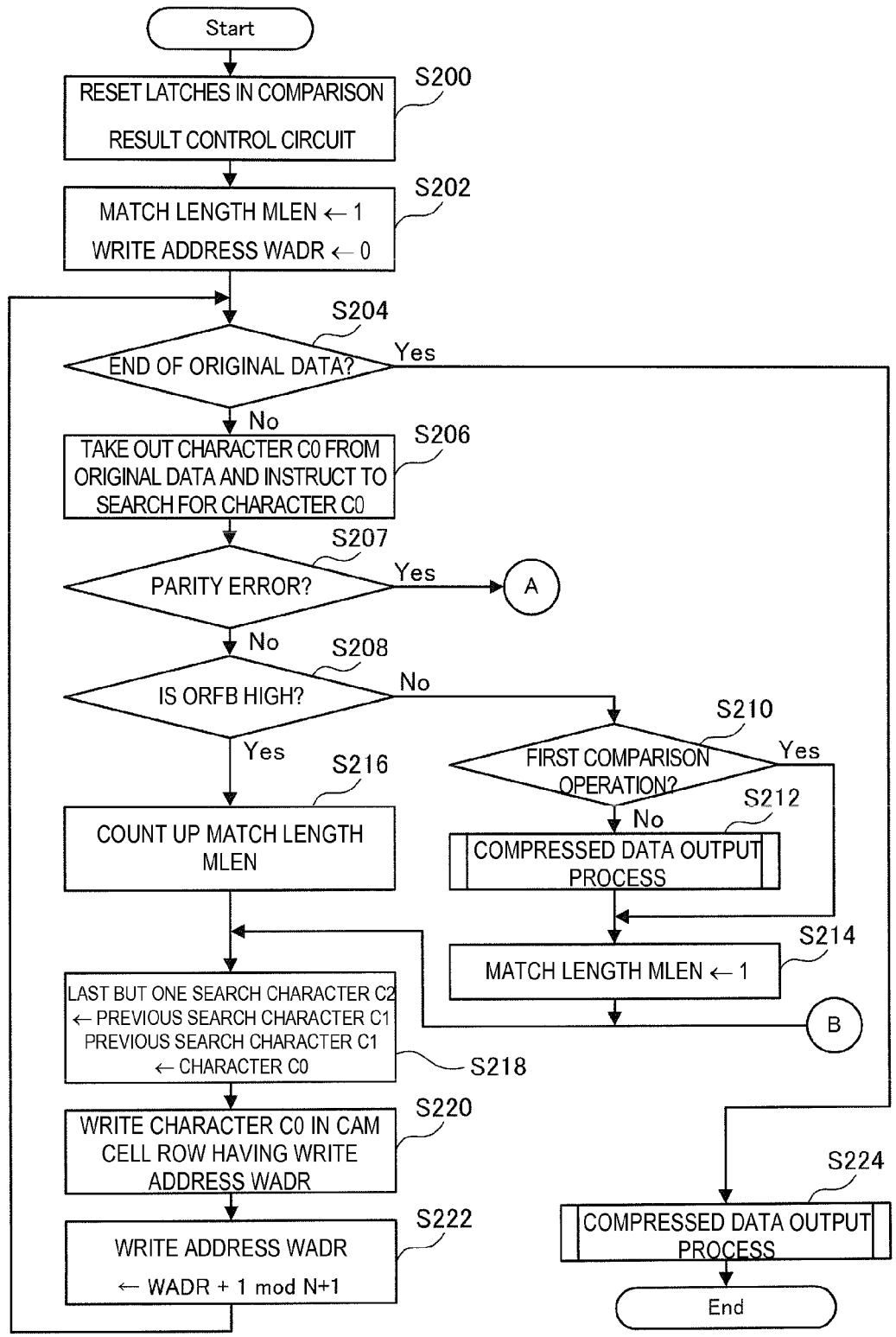
Figures 2, 10:
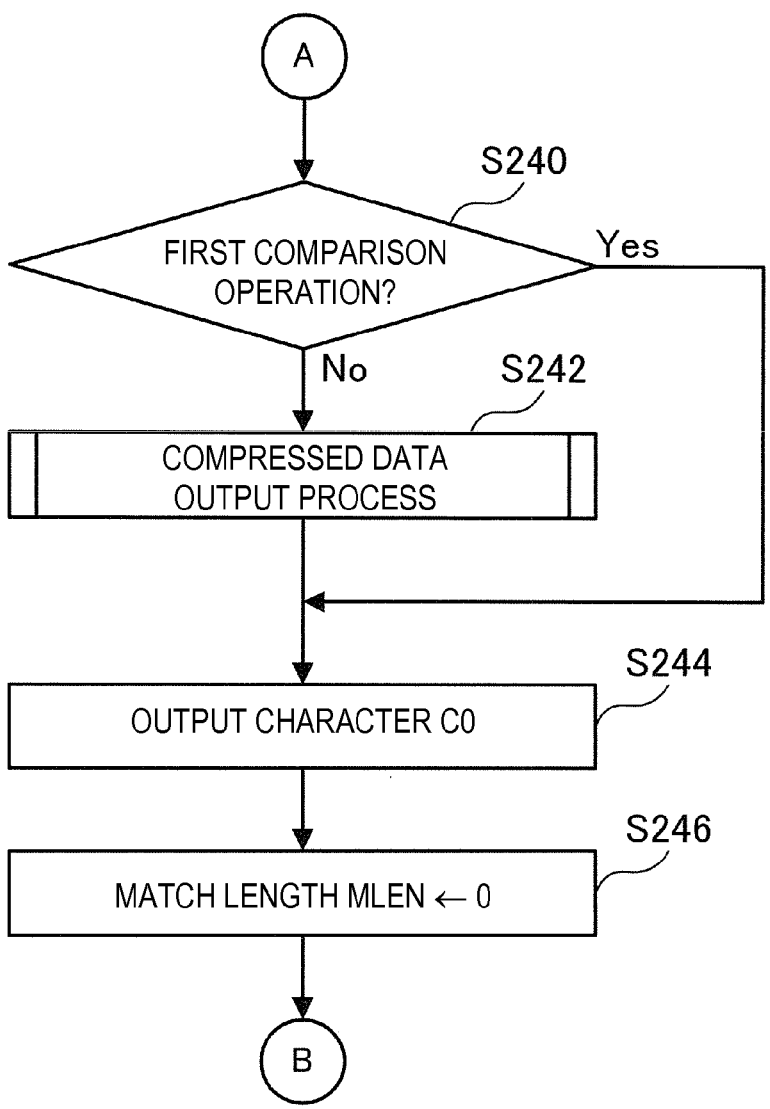

FIGS. 10-1 and 10-2 are flowcharts illustrating a process in the data compression controller 22. The process is initiated when data to be compressed (original data) is transferred to the data compression controller 22 through the bus 18 and an instruction to compress the original data is issued from the CPU 12.

The data compression controller 22 first resets the latches $62_0$ to $62_N$ and latches $66_0$ to $66_N$ of the comparison result control circuit 60 of the repeated data search device 20 (step 200). The data compression controller 22 then initializes the match length MLEN to "1" and the write address WADR to "0" (step 202). The data compression controller 22 then determines whether or not the output of the original data to the repeated data search device 20 has been completed (step 204). If the determination is negative, the data compression controller 22 takes out character C0 data corresponding to the first one character from the original data as search data and outputs the data to the repeated data search device 20 along with a search instruction SEARCH and a write address WADR (step 206). As a result, the character C0 data is provided to the uncompression data path and the compression data path in the repeated data search device 20 and the search operation described above is performed.

The data compression controller 22 then determines whether or not a parity error signal PE has gone high (step 207). A process performed if the parity error signal PE has gone high and the determination is affirmative will be described later. If the parity error signal PE is low and the determination is negative, the data compression controller 22 determines whether or not a character string match signal ORFB output from the repeated data search device 20 has gone high (step 208). In this case, since the latches 62 and the latches 66 have been previously reset at step 200, the character string match signal ORFB is held low. Therefore the determination is negative and the process proceeds to step 210, where the data compression controller 22 determines whether or not the current comparison operation is the first comparison operation for given original data (step 210). If the determination is affirmative, the process proceeds to step 214 without performing a process for outputting compressed data at step 212. Since the character string match signal ORFB does not go high unless there are matches with two or more successive characters as described earlier, the character previously searched for is output as compressed data if the comparisons result in successive "mismatches" as will be described later. Accordingly, there is no data to be output as compressed data at this point in time and therefore step 212 is not performed.

Then, the data compression controller 22 assigns "1" to the match length MLEN (step 214) and proceeds to step 218. The data compression controller 22 then sets the data of the previous search character C1 in place of the data of the previous search character C2 (step 218) and sets the data of the current search character C0 in place of the previous search character C1 (step 218) and writes the data of the character C0 in the CAM cell row corresponding to the current write address WADR (0 for the first comparison operation) (step 220). The write operation is performed by the address decoder 52 asserting (enabling) the word line of the CAM cell row corresponding to the write address WADR. The data compression controller 22 adds 1 to the write address WADR (accordingly, the character data is written in ascending order of CAM cell row addresses), divides the result by the size N+1 of the CAM cell array 26 and sets the remainder as the next write address WADR (step 222).

Once the data has been written in all CAM cell rows in this way, the data is written in the CAM cell row with the address "0". Thus the CAM cell array 26 is used as the so-called ring buffer and an overflow of the CAM cell array 26 does not occur.

After the process at step 222 has been performed, the process returns to step 204. If the determination at step 204 is negative, step 206 and the subsequent steps are performed again. At step 206, data of the character C0, which was the search character C1 in the previous iteration, is taken out from the original data as search data and is output to the repeated data search device 20 along with a search instruction SEARCH and a write address WADR. If the determination at step 208 is negative, the process proceeds to step 210. If the determination at step 210 is negative, a compressed data output process at step 212 is performed.

Figure 11:
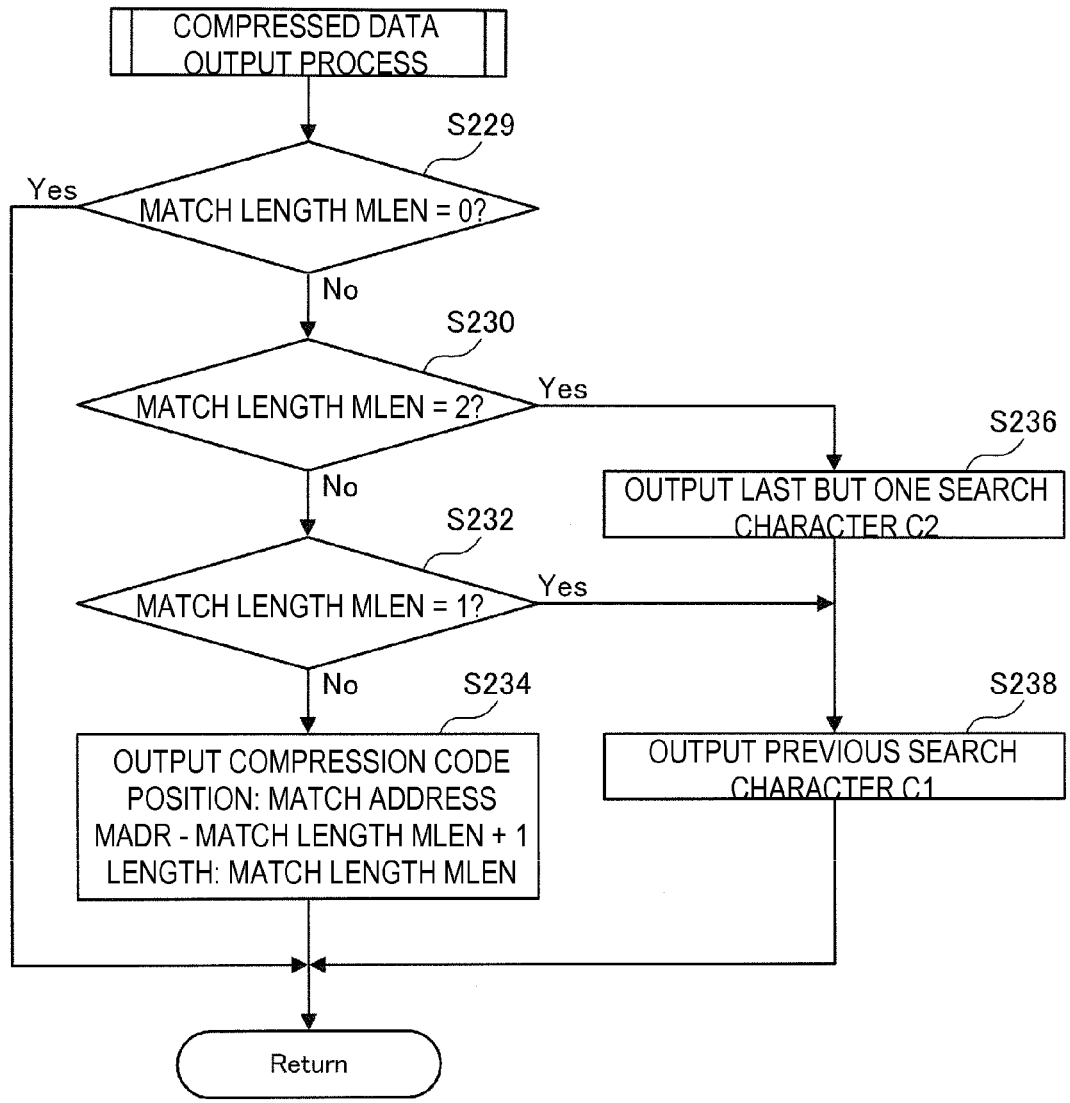
FIG. 11 is a flowchart illustrating details of a compressed data output process in the flowchart of FIG. 10.

In the compressed data output process, the data compression controller 22 determines whether the match length MLEN is 0 or not as illustrated in FIG. 11 (step 229). If the previous parity error signal PE is high, all of the past data has been output by a process, which will be described later, and the match length MLEN has been set to 0. Accordingly, data is not output as compressed data and the process proceeds to step 214 of the flowchart of FIG. 10-1.

If the determination at step 229 is negative, the data compression controller 22 determines whether the match length MLEN is 2 or not (step 230). If the result of the previous comparison is a "match" but the result of the last comparison but one is not a "match", then the determination is affirmative and the data of the previous_search_character_C2 is output as compressed data (step 236), then the data of the previous_search_character_C1 is output (step 238), and then the process proceeds to step 214 of the flowchart of FIG. 10-1.

If the determination at step 230 is negative, the data compression controller 22 determines whether the match length MLEN is 1 or not (step 232). If the result of the previous comparison is not a "match", the determination is affirmative and the data of the previous_search_character_C1 is output as compressed data (step 238), then the process proceeds to step 214 of the flowchart of FIG. 10-1.

On the other hand, if the determination at step 208 of the flowchart of FIG. 10-1 is affirmative, the match length MLEN is counted up (step 216), then the process proceeds to step 218. Accordingly, compressed data is not output while the character string match signal ORFB stays high.

If the characters string match signal ORFB, which was high in the previous comparison operation, goes low and the determination at step 210 is negative, it means that the end of a repeated character string having a length greater than or equal to two characters has been found and therefore the compressed data output process is performed at step 212. Here, if the results of both of the previous comparison and the penultimate comparison are "matches", the match length MLEN has been counted up to 3 or greater at step 216 described above and therefore the determinations at steps 229, 230 and 232 are negative and the process proceeds to step 234.

The data compression controller 22 obtains a compression code for compressing the repeated character string. The present embodiment uses a compression code including a first code representing a pointer pointing to the position of the same character string as a repeated character string and a second code representing the length of the repeated character string. The data compression controller 22 sets the difference between the match address MADR and the match length MLEN plus 1 (MADR−MLEN+1) as the first code, sets the match length MLEN as the second code, and outputs the values (step 234). Consequently, the compressed data output from the data compression controller 22 is shorter than the original data.

Note that to output the compressed data, the data compression controller 22 also inserts a code representing a separator between the character data and the compression code in order to allow the compression code and the character data to be distinguished from each other when the compressed character string is decompressed. In this way, the step 234 is performed every time a repeated character string is found and the found repeated character string is converted to a conversion code and output, thereby eliminating the redundancy of the original data to compress the original data into compressed data.

If the determination at step 207 of the flowchart of FIG. 10-1 is affirmative, the process proceeds to step 240 of the flowchart of FIG. 10-2. If the determination at step 240 is negative, the compressed data output process at step 242 is performed. The compressed data output process has been described with reference to the flowchart of FIG. 11 and therefore the description of the compressed data output process will be omitted.

If the parity error signal PE goes high, the character string match signal ORFB is not reliable. Accordingly, the character C0 obtained through the uncompression data path of the repeated data search device 20 is output at this point in time (step 244). Then "0" is assigned to the match length MLEN (step 246), the process proceeds to step 218 of the flowchart of FIG. 10-1, and then the process described above is continued.

The process described above is repeated and, when the character C data takeout position in the original data reaches the end of the original data, the determination at step 204 will be affirmative and the data compression controller 22 performs the compressed data output process again (step 224). Here, if the value of the match length MLEN is greater than or equal to 3, a compression code is output at step 234; if the value of the match length MLEN is 2, the data of the penultimate search character C2 and the data of the previous search character C1 are output at steps 236 and 238, respectively, as compressed data; if the value of the match length MLEN is 1, the data of the previous search character C1 is output at step 238 as compressed data. Then the process ends.

Note that while a pointer pointing to the position of the same character string as a repeated character string is used as the first code in the compression code in this example operation, the distance between the position of the same character string as a repeated character sting and the position of the repeated character string may be used according to the example described above. In that case, the first code may be WADR minus the position of the same character string as the repeated character string.

In the present embodiment, the uncompression data path through which input character data is passed without change and the compression data path that outputs the position and length of a character string in the CAM that includes successive matches with input character data are provided in the repeated data search device 20 as described above. If a parity error occurs in the CAM, the character data from the uncompression data path is used. This enables the process using the character data to be continued without interruption even though the parity error occurs in the character data in the CAM.

The cases where a parity error occurs are summarized below:

—Case 1: Temporary Error

This error occurs incidentally and singly due to the influence of cosmic rays, noise or other factors. In this case, when the data is read again, the error might not reoccur.

—Case 2: Permanent Error

Permanent errors can be caused by cell failures. Cell failures typically occur in operation of the CAM. In this case, when the data is read again, the error reoccurs. However, an error in a memory cell might not result in a parity error. For example, if a cell failure results in a memory cell outputting a particular value, if the outputted value is the proper value, a parity error will not occur due to the failed cell.

The present embodiment is effective in both of cases 1 and 2.

—Case 1 error is temporary and therefore decreases the compression ratio only temporarily. In case 2, the compression ratio decreases whenever the failed cell is hit. However, since data itself is not corrupted in either case, the errors do not cause any problem in the present embodiment.

While it is assumed that a particular portion of a character string is replaced with information indicating the position and length of another portion to compress the character string in the present embodiment, a particular portion of a character string may be processed on the basis of the position of another portion. In that case, the compression data path may be a path from the point of the CAM cell array 26 at which character data is input to the point at which the address of character data that matches the character data is output and the uncompression data path may be a path having a pipeline configuration that outputs character data in synchronization with the output of the address from the compression data path.

While a parity bit is stored in the CAM cell array 26 in the present embodiment, the parity bit may be stored in a memory different from the CAM cell array 26. While a parity error has been given above as an error that occurs in data stored in the CAM cell array 26, the present inventive subject matter is also applicable to a situation where an error other than a parity error occurs.

While the present inventive subject matter has been described with an embodiment thereof, the technical scope of the present inventive subject matter is not limited to the embodiment described above. It will be apparent to those skilled in the art that various modifications can be made and variations can be used without departing from the spirit and scope of the present inventive subject matter.

The invention claimed is:

1. A device comprising:
   a plurality of content addressable memories, wherein each content addressable memory of the plurality of content addressable memories includes error detection circuitry for each word entry of the content addressable memory, the error detection circuitry configured to generate an error signal when an error is detected for the word entry and content of the word entry matches search data;
   counting circuitry that counts a number of sequential repeats of search data detected by at least one of the plurality of content addressable memories without an error;
   compression circuitry that generates compression information for a sequentially repeating search data that repeats for a compression threshold;
   a data path to carry search data in accordance with a number of stages for the plurality of content addressable memories to search for a match with the search data; and
   selection circuitry that selects input from the data path when the error detection circuitry of any one of the plurality of content addressable memories generates an error signal, that selects input from the compression circuitry when none of the error detection circuitries of the plurality of content addressable memories generates an error signal over a span of a detected sequence of repeating search data that repeats for a compression threshold, and that outputs a selected input.

2. The device of claim 1, wherein the selection circuitry is configured to select input from a second data path when none of the error detection circuitries of the plurality of content addressable memories generates an error signal and a sequence of search data has not repeated for the compression threshold.

3. The device of claim 2, wherein the second data path comprises at least two store elements, and wherein the compression circuitry is configured to store search data in a first of the at least two store elements when the plurality of content addressable memories do not generate an indication of a match for the search data or the counting circuitry does not generate an indication of sequential repeating for the compression threshold for the search data.

4. The device of claim 3, wherein the compression circuitry is also configured to move content in the first of the at least two store elements into a second of the at least two store element before storing the search data into the first of the at least two store elements.

5. The device of claim 1, wherein the selection circuitry being configured to select input from the second data path comprises the selection circuitry being configured to select input from only the first of the at least two store elements when search data does not repeat and to select input from multiple of the at least two store elements when search data sequentially repeats less than the compression threshold.

6. The device of claim 1, wherein the data path to carry search data in accordance with a number of stages for the plurality of content addressable memories to search for a match with the search data comprises n store elements, wherein n is the number of stages for the plurality of content addressable memories to search for a match with the search data.

7. The device of claim 6, wherein the store elements comprise flip-flops.

8. The device of claim 6, wherein the selection circuitry that selects input from the data path when the error detection circuitry of any one of the plurality of content addressable memories generates an error signal is configured to select data stored in the nth store element when the error detection circuitry of any one of the plurality of content addressable memories generates an error signal.

9. The device of claim 6, wherein n is four.

10. A device comprising:
    a processor;
    a data path configured to pass search data elements through one or more stages;
    a first circuit configured to,
       determine that one or more stored data elements match a search data element; and
       determine that one or more stored data elements includes a parity error;
    a second circuit coupled with the first circuit, the second circuit configured to,
       determine that a stored data element matched a previous search data element, wherein the previous search data element sequentially precedes the search data element;
       determine that the stored data element sequentially precedes a first stored data element of the one or more stored data elements;
       responsive to a determination that the stored data element matched the previous search data element and a determination that the stored data element sequentially precedes the first stored data element of the one or more stored data elements,
          generate a match signal indicating that a sequence of stored data elements matches a sequence of search data elements; and
          indicate a match address; and
       responsive to a determination that the one or more stored data elements includes a parity error, generate an error signal indicating that the one or more stored data elements includes the parity error; and
    a third circuit coupled with the second circuit, the data path and the processor, the third circuit configured to,
       count the number match signals generated by the second circuit; and
       output one of a search data element from the data path and a compression code.

11. The device of claim 10, wherein the third circuit configured to output one of a search data element from the data path and a compression code is configured to:
    output the search data element from the data path when at least one of the count of the number of match signals generated by the second circuit is less than a compression threshold and an error signal is generated by the second circuit; and output the compression code when the count of the number of match signals generated by the second circuit is greater than the compression threshold and no error signal is generated by the second circuit.

12. The device of claim 10, wherein the output search data element from the data path corresponds to a search data element that matched the last stored data element of the sequence of stored data elements.

13. The device of claim 10, wherein the compression code comprises the indication of the match address and the count of the number of match signals generated by the second circuit, wherein the indication of the match address is associated with one of the first stored data element of the sequence of stored data elements and the last stored data element of the sequence of stored data elements.

14. The device of claim 10, wherein the number of data path stages comprises the number of the stages of the first circuit, the number of the stages of the second circuit, and the number of the stages of the third circuit.

15. A method of compressing data with content addressable memory without disruption despite error, the method comprising:

using a plurality of content addressable memories to detect sequentially repeating data elements of the data;

generating compression information for each sequence of repeating data elements that repeat for at least a compression threshold without any one of the plurality of content addressable memories generating an indication of an error for a matching content addressable memory entry;

outputting individual data elements for each of the data elements that do not repeat for the compression threshold; and generating compression information for each sequence of repeating data elements that repeat for at least the compression threshold and then generating a currently searched data element that matches the repeating data elements when any one of the plurality of content addressable memories generates an indication of an error for a content addressable memory entry that matches the currently searched data element.

16. The method of claim 15, wherein the compression information comprises an indication of an address associated with a data element of the sequence of repeating data elements and a count of the data elements in the sequence of repeating data elements.

17. The method of claim 16, wherein the indication of the address associated with the data element of the sequence of repeating data elements comprises one of an address and an offset.

18. The method of claim 15, wherein said outputting the individual data elements for each of the data elements that do not repeat for the compression threshold comprises selecting an input of a plurality of inputs, wherein the input of the plurality of inputs is coupled with a data path carrying the individual data elements.

19. The method of claim 18, wherein the input of the plurality of inputs comprises a first input associated with an indication of an address and a second input associated with a count of the sequence of repeating data elements, wherein the indication of an address is associated with one of the first data element of the repeating data elements and the last data element of the repeating data elements.

20. The method of claim 15, wherein generating compression information comprises selecting an input of a plurality of inputs, wherein the input of the plurality of inputs is coupled with a data path carrying the compression information.

* * * * *